United States Patent
Deng et al.

(10) Patent No.: US 9,028,262 B2
(45) Date of Patent: May 12, 2015

(54) JUNCTION BOX, SOLAR CELL AND METHOD FOR INSTALLING BUS BAR IN JUNCTION BOX

(71) Applicant: Delta Electronics, Inc., Kuei San (TW)

(72) Inventors: Yan Deng, Kuei San (TW); Guangwei Guo, Kuei San (TW)

(73) Assignee: Delta Electronics, Inc. (TW)

( * ) Notice: Subject to any disclaimer, the term of this patent is extended or adjusted under 35 U.S.C. 154(b) by 111 days.

(21) Appl. No.: 13/890,842

(22) Filed: May 9, 2013

(65) Prior Publication Data
US 2014/0162476 A1 Jun. 12, 2014

(30) Foreign Application Priority Data
Dec. 6, 2012 (CN) .......................... 2012 1 0516972

(51) Int. Cl.
| | |
|---|---|
| H01R 13/68 | (2011.01) |
| H01R 43/18 | (2006.01) |
| H01L 31/00 | (2006.01) |
| H01R 12/70 | (2011.01) |
| H01R 12/71 | (2011.01) |
| H01R 12/57 | (2011.01) |
| H01R 13/22 | (2006.01) |

(52) U.S. Cl.
CPC ........... *H01R 43/18* (2013.01); *Y10T 29/49117* (2015.01); *H01L 31/00* (2013.01); *H01R 12/57* (2013.01); *H01R 12/7088* (2013.01); *H01R 12/718* (2013.01); *H01R 13/22* (2013.01)

(58) Field of Classification Search
USPC ........................................ 439/76.1, 709, 772
See application file for complete search history.

(56) References Cited

U.S. PATENT DOCUMENTS

| | | | | |
|---|---|---|---|---|
| 4,310,211 | A | * | 1/1982 | Bunnell et al. ................ 439/358 |
| 4,460,232 | A | * | 7/1984 | Sotolongo ...................... 439/535 |
| 4,562,311 | A | * | 12/1985 | Dola .......................... 379/27.08 |
| 7,444,743 | B2 | * | 11/2008 | Feldmeier et al. .............. 29/748 |
| 7,591,690 | B1 | | 9/2009 | Chien et al. |
| 7,723,609 | B2 | * | 5/2010 | Yoshikawa et al. ........... 136/244 |
| 7,824,190 | B2 | * | 11/2010 | Beck et al. .................... 439/76.1 |
| 7,960,650 | B2 | * | 6/2011 | Richter et al. .................. 174/50 |
| 8,003,885 | B2 | * | 8/2011 | Richter et al. .................. 174/50 |
| 8,137,115 | B1 | | 3/2012 | Chou et al. |
| 8,308,504 | B2 | * | 11/2012 | Ackermann et al. .......... 439/496 |

(Continued)

FOREIGN PATENT DOCUMENTS

| | | |
|---|---|---|
| CN | 101461109 | 6/2009 |
| TW | 20102013 | 3/2010 |

(Continued)

*Primary Examiner* — Neil Abrams
(74) *Attorney, Agent, or Firm* — Lowe Hauptman & Ham, LLP

(57) ABSTRACT

The present invention provides a junction box, which comprises a base, a housing, and a PCB in the housing, a hole is set in the base, and a supporting frame is set on the base; a terminal corresponding to the supporting frame is set on the PCB; a bus bar can pass through the hole and is set on the supporting frame; the terminal is electrically connected with the PCB; when the housing is coupled to the base, the terminal is pressed to fit the corresponding supporting frame; and the PCB is electrically connected to the bus bar through the terminal. The advantage of the present invention is that the PCB is set on the housing. The supporting frame is matched to the terminal, which can electrically connect the bus bar and the PCB, and install the bus bar, to avoid using screws.

9 Claims, 7 Drawing Sheets

(56) References Cited

U.S. PATENT DOCUMENTS

| | | | |
|---|---|---|---|
| 8,388,358 B2* | 3/2013 | Thompson et al. | 439/76.1 |
| 8,403,711 B2* | 3/2013 | Xue et al. | 439/709 |
| 8,523,586 B2* | 9/2013 | Eusterholz | 439/259 |
| 8,647,160 B2* | 2/2014 | Umemoto et al. | 439/845 |
| 8,678,864 B2* | 3/2014 | Yoshikawa et al. | 439/709 |
| 8,723,031 B2* | 5/2014 | Masumoto | 174/50 |
| 8,771,027 B2* | 7/2014 | Zhang et al. | 439/835 |
| 8,809,699 B2* | 8/2014 | Funk | 174/562 |
| 8,900,019 B2* | 12/2014 | Yamaguchi et al. | 439/747 |
| 8,963,000 B2* | 2/2015 | Xiao et al. | 174/60 |
| 2010/0018572 A1 | 1/2010 | Grimberg et al. | |
| 2013/0265691 A1* | 10/2013 | Ohmori | 361/601 |
| 2014/0162476 A1* | 6/2014 | Deng et al. | 439/76.1 |

FOREIGN PATENT DOCUMENTS

| | | |
|---|---|---|
| TW | 201214903 | 4/2012 |
| TW | M427672 | 4/2012 |

* cited by examiner

JUNCTION BOX, SOLAR CELL AND METHOD FOR INSTALLING BUS BAR IN JUNCTION BOX

TECHNICAL FIELD OF THE INVENTION

The present invention relates to a field of solar energy, and more particularly to a junction box, a solar cell and a method for installing bus bar in a junction box.

BACKGROUND OF THE INVENTION

Solar energy is a kind of renewable energy source. Using electrical power converted from the solar energy can save power and avoid environment pollution. A junction box in a solar energy system is used for connecting solar cells and external power component to output the power of solar cells.

Generally, a PCB (Printed Circuit Board) in the junction box is installed on a base of the junction box, however, it has some disadvantages which are stated as followed. Firstly, the PCB generates a large quantity of heat in a working condition. The heat is transferred to a body of the junction box by air in the junction box, and then released. The heat is also transferred to the base of the junction box. So the quantity of heat can not be released in time for low thermal conductivity of the air, and this causes temperature rising in the junction box, such to reduce the lifespan of the PCB for a high temperature condition. Meanwhile, the high temperature can accelerate warp and aging of the junction box. Secondly, the PCB, which is installed on the base of the junction box, will fail if water enters into the junction box.

In prior art, a bus bar is used for electrical connection structure between the solar cell and the junction box. One edge of the bus bar is electrically connected to positive or negative electrode of the solar cell, and another edge is electrically connected to the PCB with screws. Meanwhile, the bus bar is installed on the base and the cover is snapped on the base to reinforce the electrical connection structure. An operator must be careful because the bas bars are very thin. So, the structure mentioned above is complex, and resembling work is hard and time consuming.

SUMMARY OF THE INVENTION

To solve the above-mentioned drawbacks, an object of the present invention is to provide a junction box, a solar cell and a method for installing the bus bar in a junction box.

In order to solve the problem mentioned above, the present invention provides a junction box, which comprises a base, a housing, and a PCB in the housing, a hole is set in the base, and a supporting frame is set on the base; a terminal corresponding to the supporting frame is set on the PCB; a bus bar can pass through the hole and is set on the supporting frame; the terminal is electrically connected with the PCB; when the housing is coupled to the base, the terminal is pressed to fit the corresponding supporting frame; and then the PCB is electrically connected to the bus bar through the terminal.

Optionally, a pair of guiding columns are set on a surface of the supporting frame towards the terminal, when the bas bar passes through the guiding columns, the guiding columns can restrict horizontal movement of the bus bar.

Optionally, a number of the guiding columns is four, and the four guiding columns are set symmetrically.

Optionally, a spring plate is set on a surface of the terminal towards the base, the edge of the spring plate is bending out, to press fit with the corresponding supporting frame.

Optionally, a number of the guiding columns is two, the two guiding columns are set oppositely on the supporting frame, a groove is set on upper surface of each one of the guiding columns, the grooves are used for the bus bar passing through and restricting the horizontally movement of the bus bars.

Optionally, a convex block is set between the two guiding columns, a groove is set on the corresponding terminal, when the terminal is pressed to fit the supporting frame, the convex block is embedded into the groove.

Optionally, a inner bended spring plate is set on a surface of the terminal towards the base, when the terminal is pressed to fit the supporting frame, the spring plate is coupled to the convex block.

Optionally, the supporting frame is set near the hole.

Optionally, the junction box further comprises a hasp, to lock the bas and the housing.

Optionally, the hasp comprises a hasp head set outside of the base and a hasp groove set on the housing correspondingly; when the housing is coupled to the base, the hasp head is inserted into the hasp groove, to lock the base and the housing The present invention further provides a method for installing a bus bar in the junction box mentioned above, which comprises the following steps: providing a base; inserting a terminal of the bus bar connected to a solar cell into the base through a hole; setting the bas bar on a supporting frame; and coupling a housing to the base.

The present invention further provides a solar cell, which comprises a PCB, a plurality of bus bar, and the junction box mentioned above, one terminal of the bas bar is electrically connected to a solar cell panel, and another terminal is inserted into the junction box through a hole; the bus bar is set on a supporting frame; and when the terminal is press fit on the corresponding supporting frame, the terminal is electrically connected to the bus bar.

The advantage of the present invention is that the PCB is set on the housing, which is benefit for transferring the heat out through the housing. The supporting frame is matched to the terminal, which can electrically connect the bus bar and the PCB, and install the bus bar, to avoid using screws. So the bus bar is easily installed and the operation time is saved.

DETAILED DESCRIPTION OF THE INVENTION

Embodiments of a junction box, a solar cell and a method for installing the bus bar in a junction box by the present invention are described in detail with the following accompanying diagrams.

Figure 1:
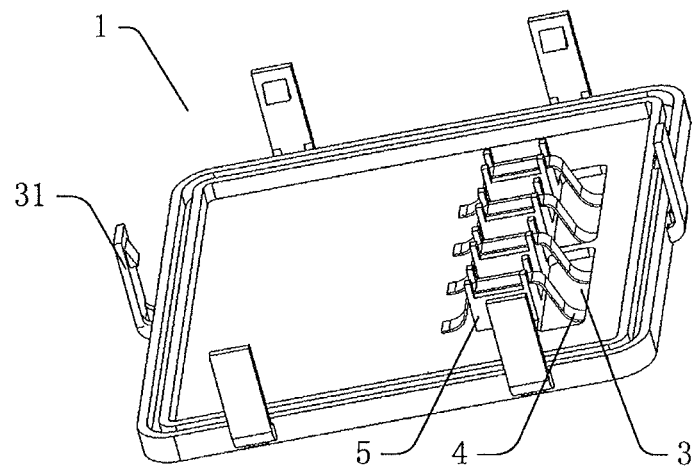
FIG. 1 illustrates a diagram of base of a junction box in an embodiment of this invention.

A junction box comprises a base and housing in one embodiment of this invention. FIG. 1 illustrates a diagram of the base of the junction box. Referring to FIG. 1, holes 3 are set in the base 1 of the junction box, and bus bars 4 extend into the junction box through the holes 3. The bus bars 4, a part of other module (for example, a solar cell), are metal strips, and are connected to electrodes of the module. The base 1 further comprises a supporting frame 5, which is used to support the bus bars 4. The bus bars 4 extend into the junction box through the holes 3, passing over the surface of the supporting frame 5. In this embodiment, the supporting frame is set closing to the holes 3. The bus bar 4 extending into the junction box through the holes 3 can touch the surface of the supporting frame 5 in a short distance, to save consumption of the bus bar. Furthermore, the thin bus bar 4 is easily snapped for a long path in the junction box.

Figure 2:
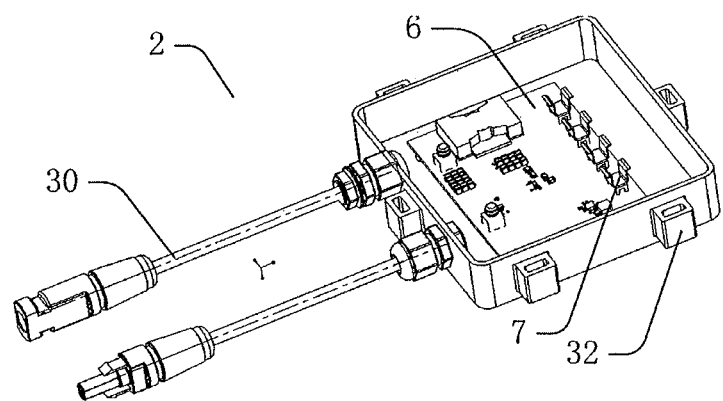
FIG. 2 illustrates a diagram of housing of a junction box in an embodiment of this invention.

FIG. 2 illustrates a diagram of a housing of the junction box in an embodiment of this invention. Referring to FIG. 2, the housing 2 comprises a PCB 6 which is set in the housing 2. The PCB 6 further comprises one or plurality of terminal 7 corresponding to the supporting frame 5. There are representational four terminals 7 in this embodiment. The terminal 7 can be pressed to fit the corresponding supporting frame 5. When the terminals 7 are pressed to fit the corresponding supporting frames 5, the terminals 7 are electrically connected to the bus bars 4, to input the power from the solar cell to the PCB 6. Cables 30 are set outside of the housing 2, to output the power of the PCB 6.

The number of the supporting frame 5, the hole 3, and the terminal 7 corresponding to the support 5 are determined by the number of the bus bar 4. In practices, the number of the bus bar 4 is four. So the numbers of the supporting frame 5, the hole 3, and the terminal 7 which respectively correspond to the support 5 are four in this embodiment. In other embodiments, the number of the bus bar 4 may be six, so the numbers of the supporting frame 5, the hole 3, and the terminal 7 which respectively correspond to the support 5 are six.

In this embodiment, there are a hasp on the base 1 and the housing 2 used to lock the base 1 and the housing 2, in order to contract closely between the base 1 and the housing 2, and to avoid dropping. In this embodiment, a hasp head 31 is set outside of the base 1, and a hasp groove 32 is set on the housing 2 correspondingly. When the housing 2 is coupled to the base 1, the hasp head 31 is inserted into the hasp groove 32, to lock the base 1 and the housing 2.

Figure 3A:
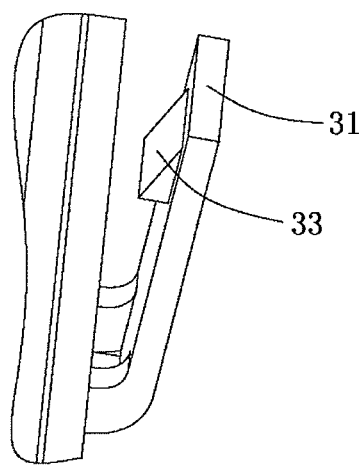
FIG. 3(a) illustrates a diagram of a hasp head on the base.
Figure 3B:
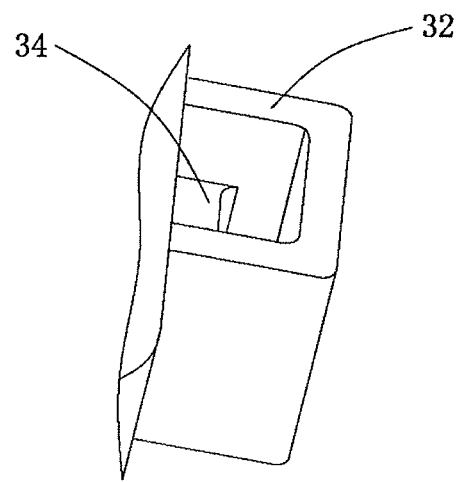
FIG. 3(b) illustrates a diagram of a hasp groove on the housing.
Figure 3C:
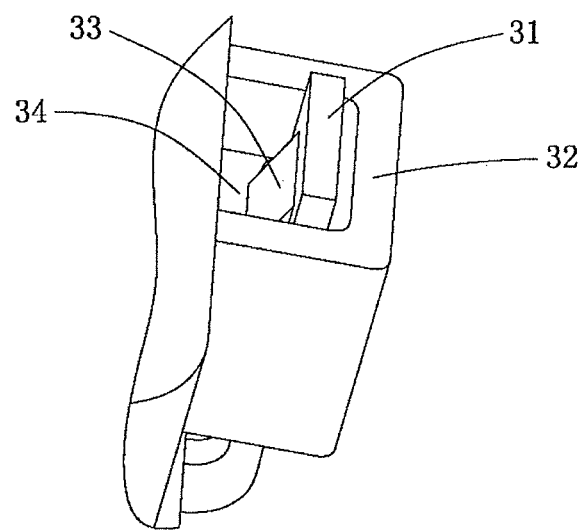
FIG. 3(c) illustrates a diagram of coupling structure of the hasp head and the hasp groove.
Figure 3D:
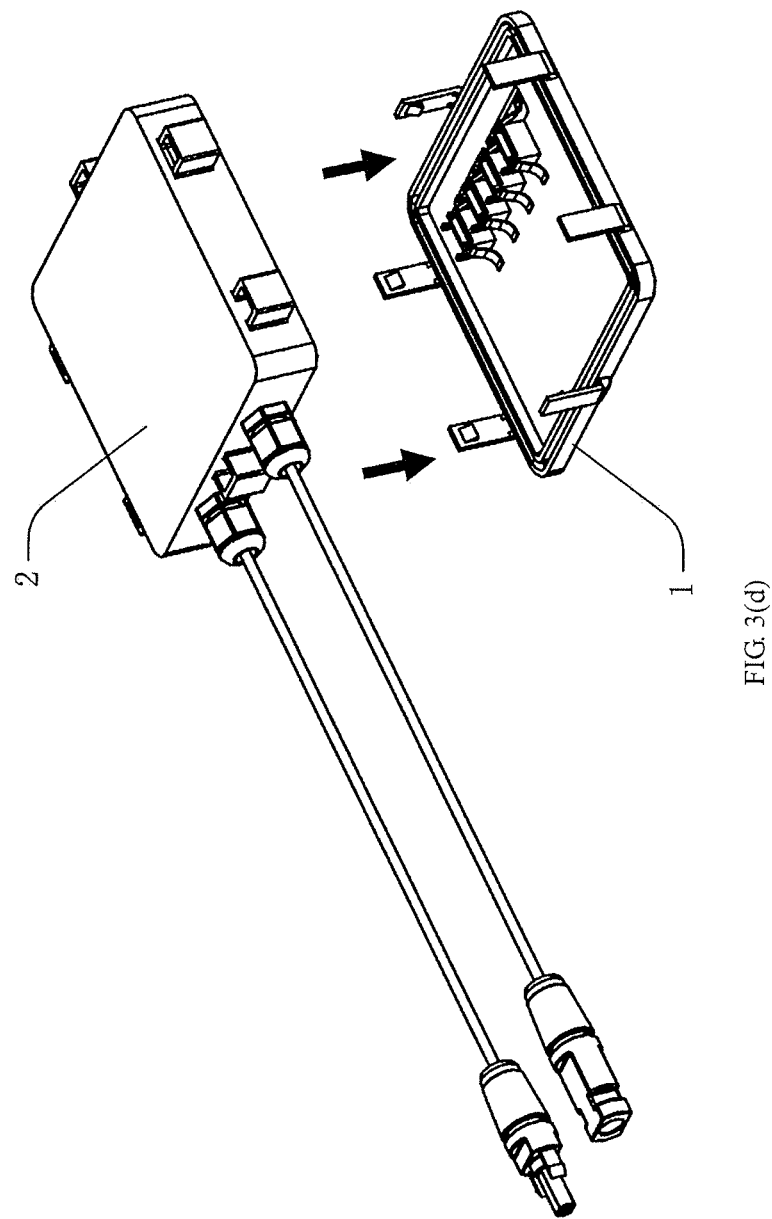
FIG. 3(d) illustrates a diagram of coupling structure of the base and the housing of the junction box.
Figure 3E:
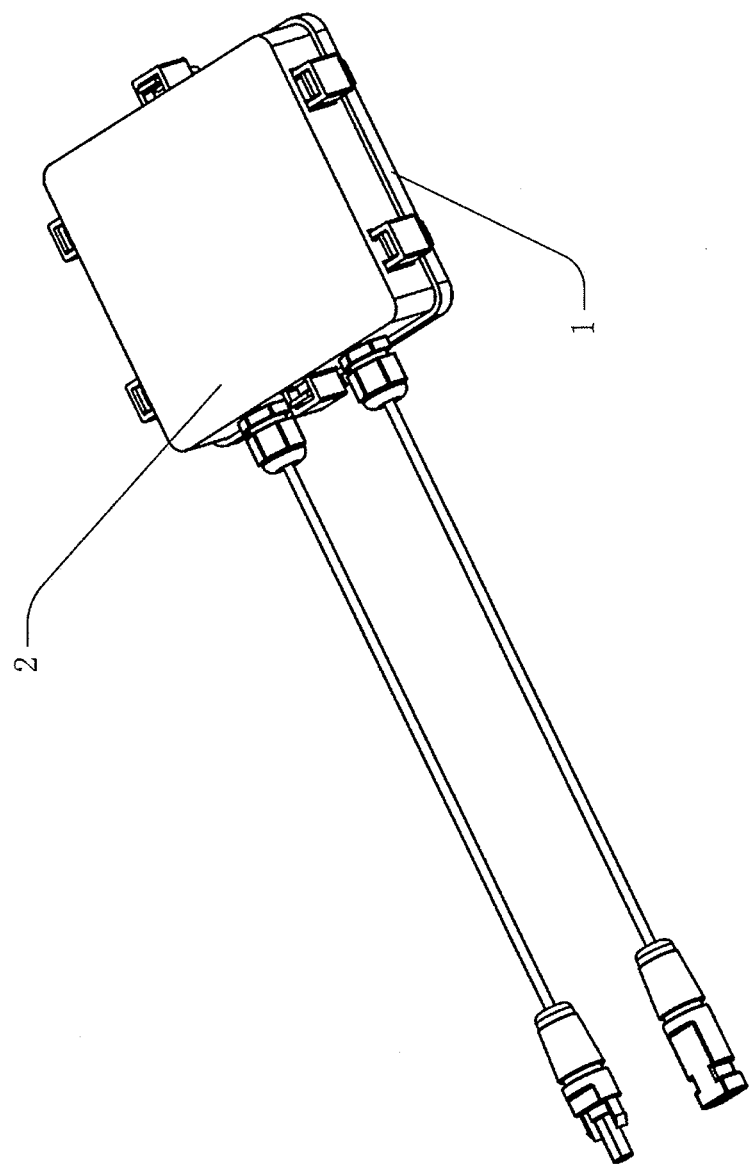
FIG. 3(e) illustrates a diagram of coupling structure of the base and the housing of the junction box.

FIG. 3(a) illustrates a diagram of the hasp head 31 on the base 1, FIG. 3(b) illustrates a diagram of the hasp groove 32 on the housing 2, and FIG. 3(c) illustrates a diagram of coupling structure of the hasp head 31 and the hasp groove 32. Referring to FIGS. 3(a), 3(b), and 3(c), a first block 33 is set on the hasp head 31, and a second block 34 is set in the hasp groove 32. When the hasp head 31 is coupled to the hasp groove 32, the first block 33 is snapped to the second block 34. Of course, there are many structures in prior arts to provide a hasp between the base 1 and the housing 2. In other embodiments of this invention, other structures familiar for a person in this technical field can also be used to lock the base 1 and the housing 2. FIGS. 3(d) and 3(e) illustrate diagrams of the coupling structure of the base 1 and the housing 2 of the junction box. The housing 2 is moved near to the base 1 and then locks on the base 1.

Figure 4A:
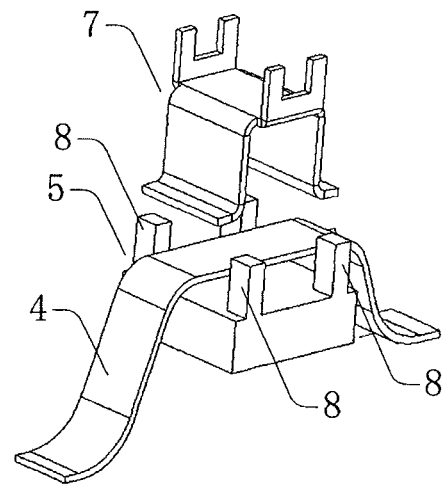
FIG. 4(a) illustrates a diagram of first structure of a supporting frame and a terminal.

Additionally, at least a pair of guiding columns are set on a surface of the supporting frame 5 towards the corresponding terminal 7. When the bas bars 4 pass through the guiding columns, the guiding columns can restrict the horizontally movement of the bus bars 4. Referring to FIG. 4(a), the guiding columns 8 are set on the surface of the supporting frame 5 towards the corresponding terminal 7. In this embodiment, there are four guiding columns 8, which are set symmetrically. When the bas bars 4 pass through the guiding columns 8, the guiding columns 8 can restrict the horizontally movement of the bus bars 4, to avoid the bus bar 4 dropping from the supporting frame 5. There are four guiding frames 8 on the supporting frame 5. The bus bars 4 can pass through the supporting frame 5 along four directions. When the supporting frame 5 is set on the base 1, any direction for the supporting frame 5 is allowed, which can save operation time and decrease defective rate.

The structure of terminal 7 is corresponded to the supporting frame 5. In this embodiment, a spring plate is set on a surface of the terminal 7 towards the base 1. The edge of the spring plate is bending out. When the terminal 7 is pressed to fit the supporting frame 5, the spring plate bended out of the terminal 7 can insert into space of the guiding columns 8, to press fit the bus bar 4 on the supporting frame 5. Furthermore, the terminal 7 is contracted to the bus bar 4, to provide electrical connection between the terminal 7 and the bus bar 4.

Figure 4B:
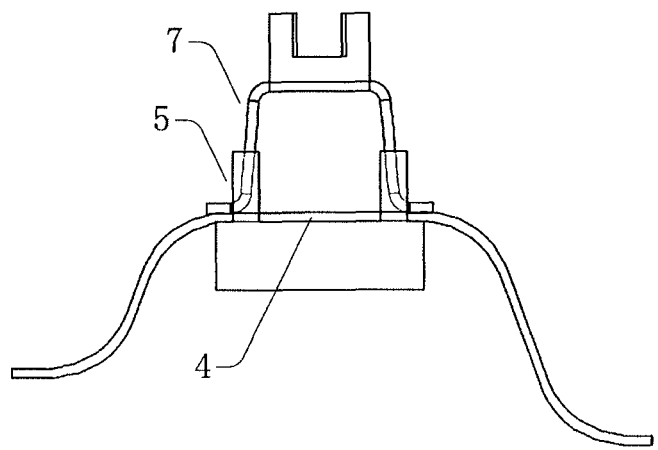
FIG. 4(b) illustrates a diagram of coupling structure of the supporting frame and the terminal in FIG. 4(a).

FIG. 4(b) illustrates a diagram of the coupling structure of the supporting frame 5 and the terminal 7 in FIG. 4(a). It can be seen in this figure, the spring plate bended out of the terminal 7 can insert into space of the guiding columns 8, and to press fit the bus bar 4 on the supporting frame 5. Furthermore, the terminal 7 is contracted to the bus bar 4, to provide electrical connection between the terminal 7 and the bus bar 4.

Furthermore, there are two guiding columns 8 which are set oppositely. A groove is set on upper surface of each one of the guiding columns 8. The grooves are used for the bus bar passing through and restricting the horizontally movement of the bus bars 4.

Figure 4C:
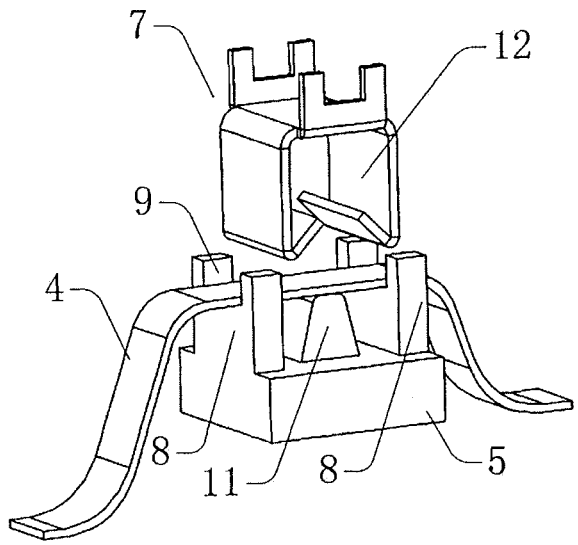
FIG. 4(c) illustrates a diagram of second structure of a supporting frame and a terminal.
Figure 4D:
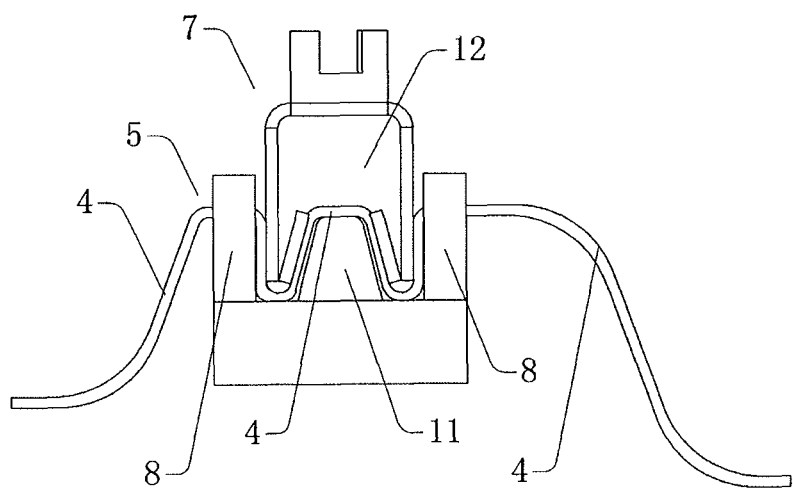
FIG. 4(d) illustrates a diagram of coupling structure of the supporting frame and the terminal in FIG. 4(c).

FIG. 4(c) illustrates a diagram of second structure of a supporting frame and a terminal, and FIG. 4(d) illustrates a diagram of coupling structure of the supporting frame and the terminal in FIG. 4(c). Referring to FIGS. 4(c) and 4(d), two guiding columns 8 are set oppositely on the frame structure 5. A groove 9 is set on upper surface of each one of the guiding columns 8. The grooves 9 are used for the bus bar passing through and restricting the horizontally movement of the bus bars 4.

Furthermore, a convex block 11 is set between the two guiding columns 8. An inner bended spring plate is set on a surface of the terminal 7 towards the base 1. The inner bended spring plate forms a groove 12 corresponding to the convex block 11. When the terminal 7 is pressed to fit the supporting frame 5, the convex block 11 is embedded into the groove 12. The bus bar 4 is between the convex block 11 and the groove 12. The groove 12 is contracted to the bus bar 4, to provide electrical connection between the terminal 7 and the bus bar 4. Additionally, the cross section of the convex block 11 is trapezoid, and bended angle of the spring plate is fit to the shape of the convex block 11. When the terminal 7 is pressed to fit the supporting frame 5, the spring plate is coupled to the convex block 11, in order to install the bus bar 4. It is more convenient for press fitting the supporting frame 5 and the terminal 7, with the bus bar 4 unbroken.

A method for installing bus bar in a junction box, which comprises the following steps: step S1, providing a base; step S2, inserting a terminal of the bus bar connected to a solar cell into the base through a hole; step S3, setting the bas bar on a supporting frame; and step S4, coupling a housing to the base.

Step S1: providing a base. A holes and a supporting frame are set in the base.

Step S2: connecting a terminal of the bus bar to the solar cell, and inserting another terminal of the bus bar into the base through the hole. Generally, material of the bus bar is metal. The solar cell and a PCB in the junction box are electrically connected by the bus bar. A terminal is set on the PCB, and the terminal can be pressed to fit the supporting frame.

Step S3, drawing the bus bar, to put the bus bar on the supporting frame, which is used to support the bus bar. Additionally, a guiding column is set on a surface of the supporting frame towards the corresponding terminal. The bus bar pass through the columns, which are used to restrict the horizontal movement of the bus bar, to avoid the bus bar dropping from the supporting frame.

Step S4, coupling a housing to the base. A matching hasp is set on the base and the housing, respectively, to lock the base and the housing, and to avoid the bus bar dropping from the supporting frame. For example, a hasp head is set on the base, and a hasp groove is set on the housing. Location of the hasp head can is matched to that of the hasp groove. When the housing is coupled to the base, the hasp head is inserted into the hasp groove, to lock the housing and the base. Of course, there are many structures in prior arts to provide a hasp between the base and the housing. In other embodiments of this invention, other structures familiar for a person in this technical field can also be used to lock the base and the housing.

When the housing is coupled on the base, the terminal is pressed to fit the corresponding supporting frame. The bas bar is in the terminal and the supporting frame. The bus bar is contracted to the terminal, and the terminal is electrically connected to the bus bar. The power from the solar cell is input into the PCB. Cables are set outside of the housing, to output the power of the PCB.

A solar cell, which comprises a PCB, a plurality of bus bar, and the junction box as mentioned above. One terminal of the bas bar is electrically connected to a solar cell panel, and another terminal is inserted into the junction box through a hole. The bus bar is set on a supporting frame. When the terminal is press fit on the corresponding supporting frame, the terminal is electrically connected to the bus bar.

The present invention has been disclosed as the preferred embodiments above, however, the above preferred embodiments are not described for limiting the present invention, various modifications, alterations and improvements can be made by persons skilled in this art without departing from the spirits and principles of the present invention, and therefore the protection scope of claims of the present invention is based on the range defined by the claims.

What is claimed is:

1. A junction box, which comprises a base, a housing, and a printed circuit board in the housing, wherein:
   a hole is set in the base, and a supporting frame is set on the base;
   a terminal corresponding to the supporting frame is set on the printed circuit board;
   a bus bar can pass through the hole and is set on the supporting frame;
   the terminal is electrically connected with the printed circuit board;
   two guiding columns are oppositely set on a surface of the supporting frame;
   a guiding groove is formed on an upper surface of each one of the guiding columns;
   the guiding groove is configured to restrict a horizontal movement of the bus bar when the bus bar passes through the guiding columns;
   a convex block is set between the two guiding columns;
   a terminal groove is set on the corresponding terminal; and
   when the housing is coupled to the base, the terminal is pressed to fit the corresponding supporting frame, the convex block is positioned into the terminal groove, and the printed circuit board is electrically connected to the bus bar through the terminal.

2. The junction box of claim 1, wherein a number of the guiding columns is four, and the four guiding columns are set symmetrically.

3. The junction box of claim 1, wherein a spring plate is set on a surface of the terminal towards the base, the edge of the spring plate is bending out, to be pressed to fit with the corresponding supporting frame.

4. The junction box of claim 1, wherein an inner bended spring plate is set on a surface of the terminal towards the base, when the terminal is pressed to fit the supporting frame, the spring plate is coupled to the convex block.

5. The junction box of claim 1, wherein the supporting frame is set near the hole.

6. The junction box of claim 1, wherein the junction box further comprises a hasp, to lock the base and the housing.

7. The junction box of claim 6, wherein the hasp comprises a hasp head set outside of the base and a hasp groove set on the housing correspondingly; when the housing is coupled to the base, the hasp head is inserted into the hasp groove, to lock the base and the housing.

8. A method for installing a bus bar in the junction box mentioned in claim 1, wherein the method comprises the following steps:
   providing a base;
   inserting a terminal of the bus bar connected to a solar cell into the base through a hole;
   setting the bas bar on a supporting frame; and
   coupling a housing to the base.

9. A solar cell, wherein which comprises a PCB, a plurality of bus bar, and the junction box mentioned in claim 1;
   one terminal of the bas bar is electrically connected to a solar cell panel, and another terminal is inserted into the junction box through a hole;
   the bus bar is set on a supporting frame; and
   when the terminal is press fit on the corresponding supporting frame, the terminal is electrically connected to the bus bar.

* * * * *